United States Patent
Radu et al.

(10) Patent No.: US 6,943,436 B2
(45) Date of Patent: Sep. 13, 2005

(54) EMI HEATSPREADER/LID FOR INTEGRATED CIRCUIT PACKAGES

(75) Inventors: Sergiu Radu, Fremont, CA (US); Steven R. Boyle, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/345,016

(22) Filed: Jan. 15, 2003

(65) Prior Publication Data

US 2004/0135239 A1 Jul. 15, 2004

(51) Int. Cl.[7] .............................................. H01L 23/02
(52) U.S. Cl. ...................... 257/678; 257/675; 257/688; 257/689; 257/660; 257/659; 257/728; 257/706; 257/707; 257/713; 257/789; 257/691; 257/758; 257/701; 257/700; 257/738; 257/690; 257/777; 257/737
(58) Field of Search ............................. 257/678, 675, 257/688, 689, 660, 659, 728, 706, 707, 713, 789, 691, 758, 701, 700, 738, 690, 777, 737

(56) References Cited

U.S. PATENT DOCUMENTS

| | | | |
|---|---|---|---|
| 4,082,394 A | 4/1978 | Gedney et al. | |
| 5,166,772 A | 11/1992 | Soldner et al. | |
| 5,357,404 A | 10/1994 | Bright et al. | |
| 5,490,040 A | 2/1996 | Gaudenzi et al. | |
| 5,561,265 A | 10/1996 | Livshits et al. | |
| 5,566,052 A | * 10/1996 | Hughes ....................... | 361/704 |
| 5,639,989 A | 6/1997 | Higgins, III | |
| 5,703,397 A | 12/1997 | Endo et al. | |
| 5,745,344 A | 4/1998 | Baska et al. | |
| 5,748,455 A | 5/1998 | Phillips et al. | |
| 5,753,857 A | * 5/1998 | Choi ......................... | 174/52.4 |
| 5,804,872 A | 9/1998 | Miyano et al. | |
| 5,825,634 A | 10/1998 | Moorehead, Jr. | |
| 6,008,536 A | 12/1999 | Mertol | |
| 6,057,600 A | * 5/2000 | Kitazawa et al. ........... | 257/728 |
| 6,063,999 A | * 5/2000 | Kelly ........................ | 174/35 R |
| 6,088,231 A | 7/2000 | Fajardo | |
| 6,137,051 A | 10/2000 | Bundza | |
| 6,140,577 A | 10/2000 | Rapaich et al. | |
| 6,198,630 B1 | 3/2001 | Cromwell | |
| 6,219,239 B1 | 4/2001 | Mellberg et al. | |
| 6,239,359 B1 | * 5/2001 | Lilienthal et al. ...... | 174/35 GC |
| 6,252,313 B1 | 6/2001 | Zhang et al. | |
| 6,259,609 B1 | 7/2001 | Kurz | |
| 6,269,863 B1 | 8/2001 | Wyler | |
| 6,278,617 B1 | 8/2001 | Yang et al. | |
| 6,288,330 B1 | 9/2001 | Chen | |
| 6,324,074 B1 | 11/2001 | Lunden | |
| 6,362,477 B1 | 3/2002 | Sowerby et al. | |
| 6,400,164 B1 | * 6/2002 | Sampath .................... | 324/750 |
| 6,455,925 B1 | 9/2002 | Laurenti | |
| 6,483,406 B1 | * 11/2002 | Sawa et al. ................. | 333/247 |
| 6,515,870 B1 | 2/2003 | Skinner et al. | |
| 6,518,660 B2 | 2/2003 | Kwon et al. | |
| 6,573,590 B1 | 6/2003 | Radu et al. | |
| 6,597,575 B1 | * 7/2003 | Matayabas et al. ......... | 361/705 |
| 6,683,796 B2 | 1/2004 | Radu et al. | |
| 6,703,704 B1 | * 3/2004 | Alcoe et al. ................ | 257/688 |

* cited by examiner

*Primary Examiner*—Eddie Lee
*Assistant Examiner*—Jungwa Im
(74) *Attorney, Agent, or Firm*—Meyertons Hood Kivlin Kowert & Goetzel, P.C.; B. Noël Kivlin; Chris D. Thompson

(57) ABSTRACT

An integrated circuit package includes a lid with EMI containment features. The lid may include a plurality of projections adapted to couple a ground plane of a circuit board.

26 Claims, 6 Drawing Sheets

EMI HEATSPREADER/LID FOR INTEGRATED CIRCUIT PACKAGES

BACKGROUND OF THE INVENTION

1. Field of the Invention

The present invention relates generally to integrated circuit (IC) packages, and more specifically to containing electromagnetic interference (EMI) generated by integrated circuits.

2. Background Information

Many electronic devices such as integrated circuits generate undesirable amounts of EMI. Typically, the "noise" generated by the integrated circuit originates from the die, and its connections to the pins through the package, and is coupled to the heatspreader or lid covering the die and then to the heatsink, which acts as an antenna that further radiates the EMI. As the EMI is coupled to neighboring components and integrated circuits, it interferes with their individual performance which may, in turn, affect the overall performance of a system. Because of the negative effects of EMI and because the level of acceptable radiated EMI is subject to strict regulatory limits, it is desirable to contain or suppress the EMI generated by an integrated circuit.

Some solutions involve grounding the heatsink and building a Faraday cage around the EMI producing chip (e.g., a CPU). This solution typically involves the use of a grounded gasket that surrounds the chip and makes contact with the heatsink. The effectiveness of this solution is dependent on having good contact between the gasket and the heatsink and between the heatsink and the chip lid. In addition, because of the gasket contacts with ground on the top layer of the PCB, the routing of the pin escapes on the top layer may be very difficult or even impossible. In such a situation, the PCB may need additional layers which increases the cost of the PCB. Furthermore, the gasket itself represents an additional cost and potential point of failure, as it is a separate part that must be added to the PCB. Gaskets may take up space on the printed circuit board in the area surrounding the chip that might otherwise be used for electronic components.

It would be beneficial to have an EMI containment system that does not require elements external to the chip package and which allows for routing of pin escapes on the top layer of a PCB.

SUMMARY OF THE INVENTION

In an embodiment, an integrated circuit package may include a lid with EMI containment features. The lid may include a plurality of projections adapted to couple a ground plane of a circuit board. The projections may be spaced along a periphery of a substrate of the package. In an embodiment, the projections may be pins.

In an embodiment, gaps between projections of a lid may promote convection or radiation of heat from the sides of a substrate to the surrounding environment. Pin escapes on a top layer of a circuit board may be routed between projections of a lid.

In an embodiment, a lid having projections coupled to circuit board may further include sides. Sides may provide additional EMI shielding for an integrated circuit package. In an embodiment, a lid having projections may be coupled to an internal ground plane of a package.

A heat sink may be coupled to a lid of a package. In an embodiment, the heatsink may be electrically isolated from the lid to inhibit coupling between the heatsink and elements of the integrated circuit package. In another embodiment, the heatsink may be electrically coupled to the lid. In still another embodiment, the heatsink may be integral to the lid.

BRIEF DESCRIPTION OF THE DRAWINGS

Other aspects of the invention will become apparent upon reading the following detailed description and upon reference to the accompanying drawings in which.

Figure 1:
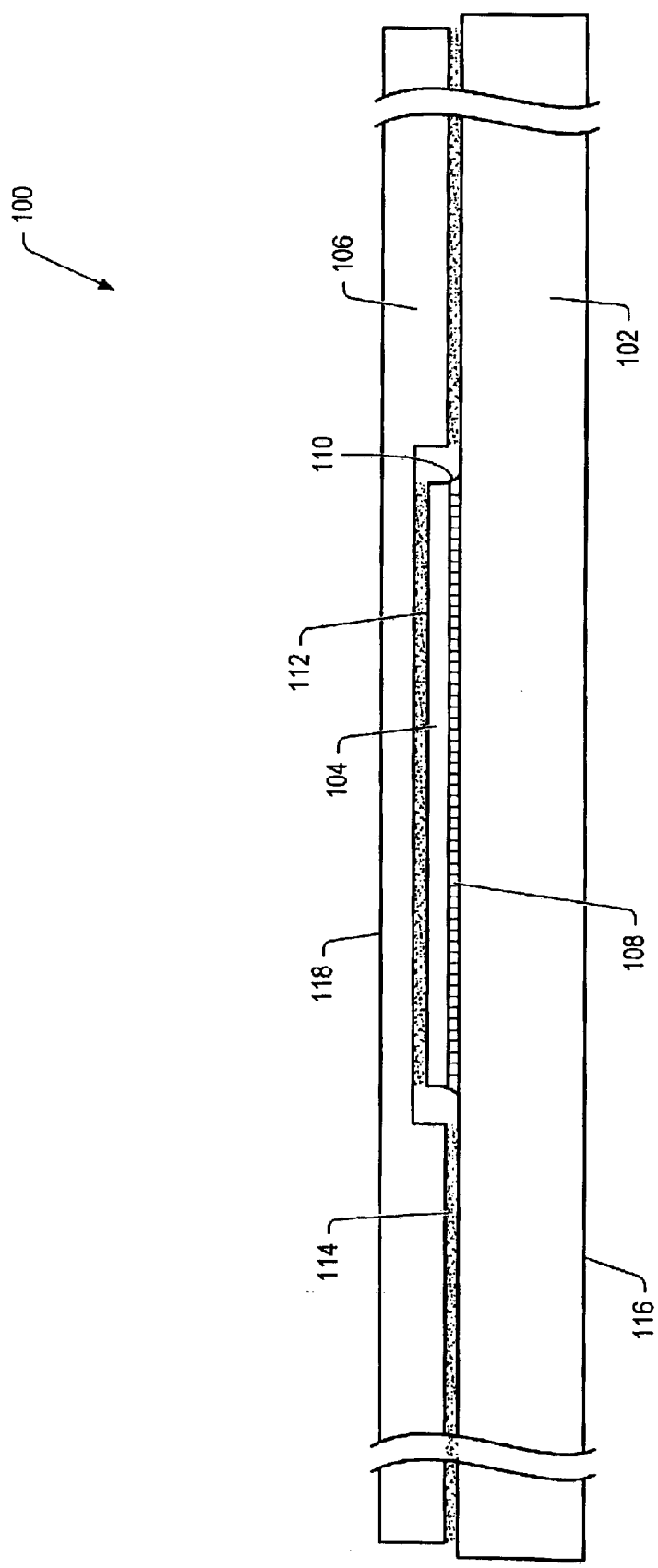
FIG. 1 depicts a side view of a typical integrated circuit package.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

FIG. 1 depicts a side view of a typical integrated circuit (IC) package 100. An integrated circuit, as used herein, may include, but is not limited to, a processor such as a central processing unit(s), or an application specific integrated circuit (ASIC). A die 104 is coupled to the top surface of a substrate 102 using conductive bumps 108. Die underfill 110 fills the gap between die 104 and substrate 102. A lid 106 is placed over die 104 and is coupled to die 104 using adhesive 112. Lid 106 is also coupled to substrate 102 using adhesive 114. Surface 116 of substrate 102 may be a socket contact surface. Surface 118 of lid 106 is the heatsink contact surface.

A typical integrated circuit package, such as IC package 100, may not include any EMI containment features. The noise originating from die 104 may be coupled to lid 106 and continue on to a heatsink (not shown) in contact with lid 106. Once the noise reaches the heatsink, it may need to be suppressed at the PCB level using a gasket, for example. Otherwise, the noise may couple from the heatsink to neighboring components, with the heatsink acting as an antenna.

Figure 2A:
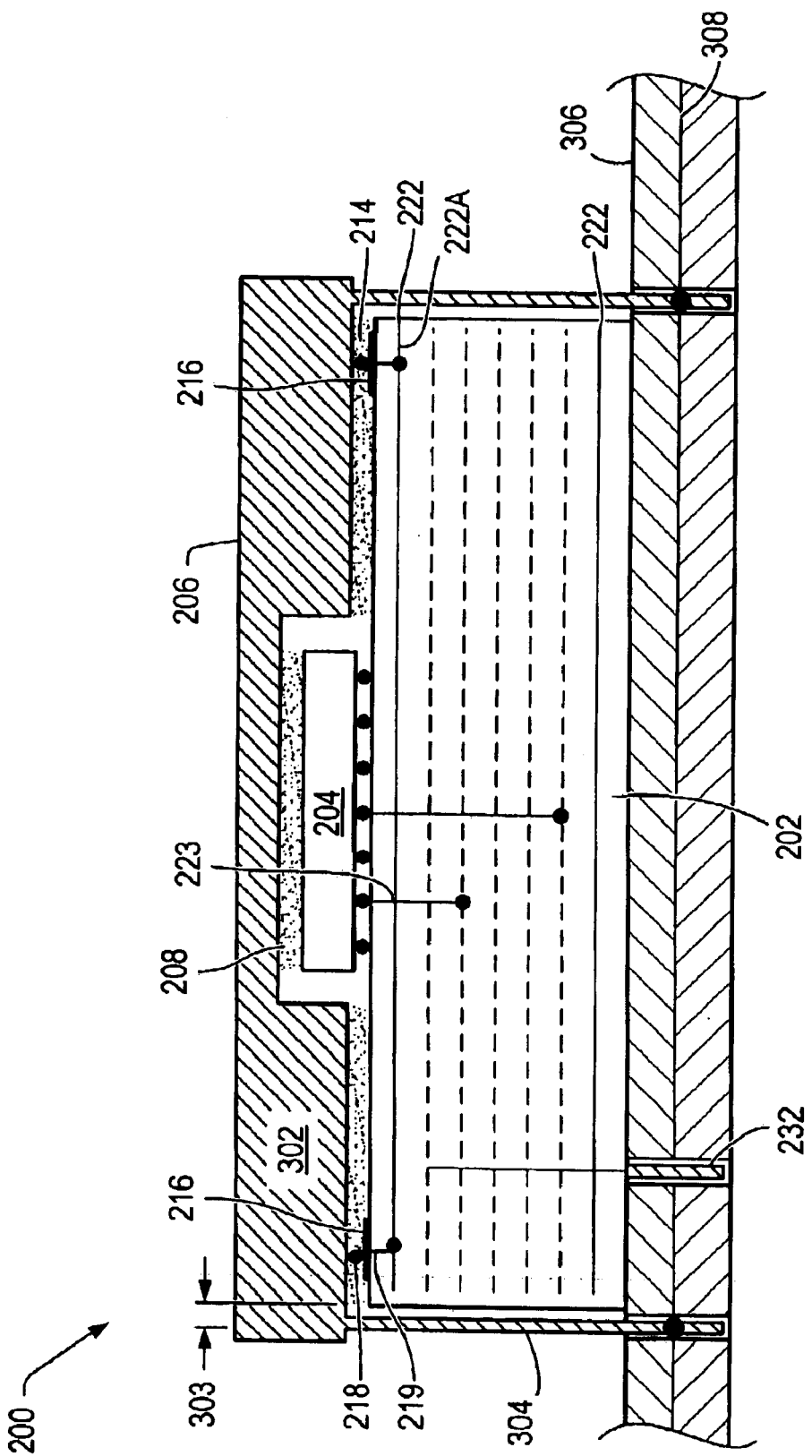
FIG. 2A depicts a cross sectional side view of an integrated circuit package.
Figure 2B:
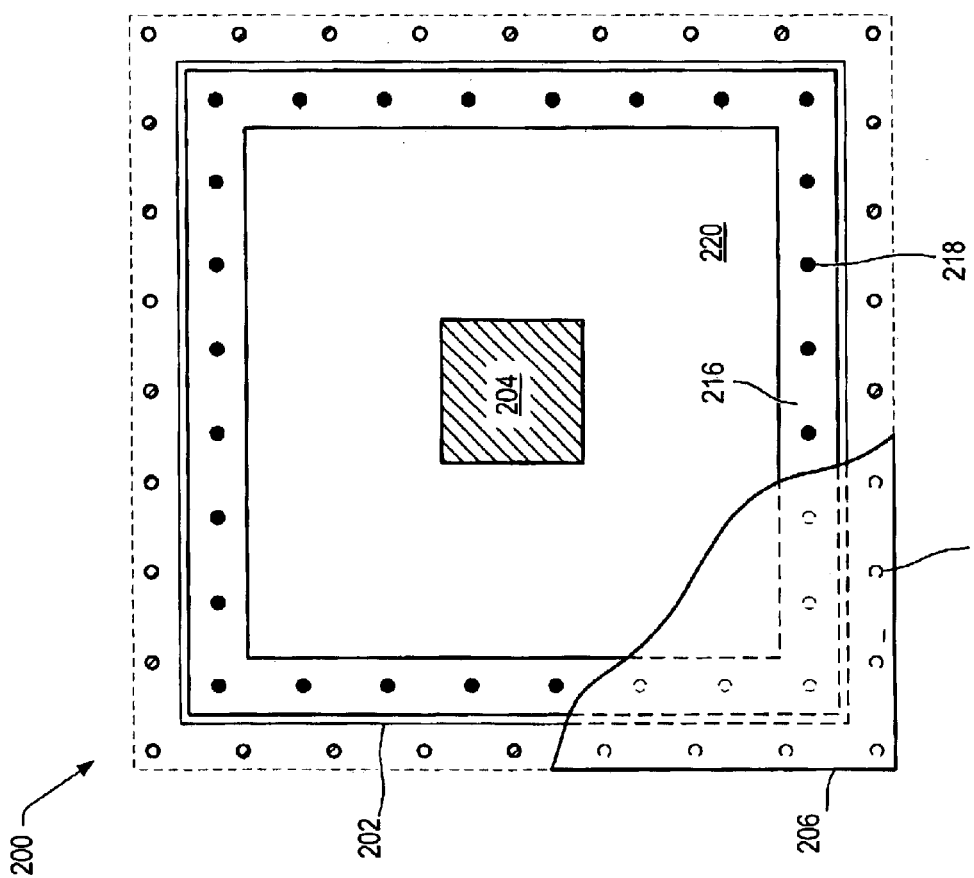
FIG. 2B depicts a cross sectional top view of the integrated circuit package of FIG. 2A.
Figure 2C:
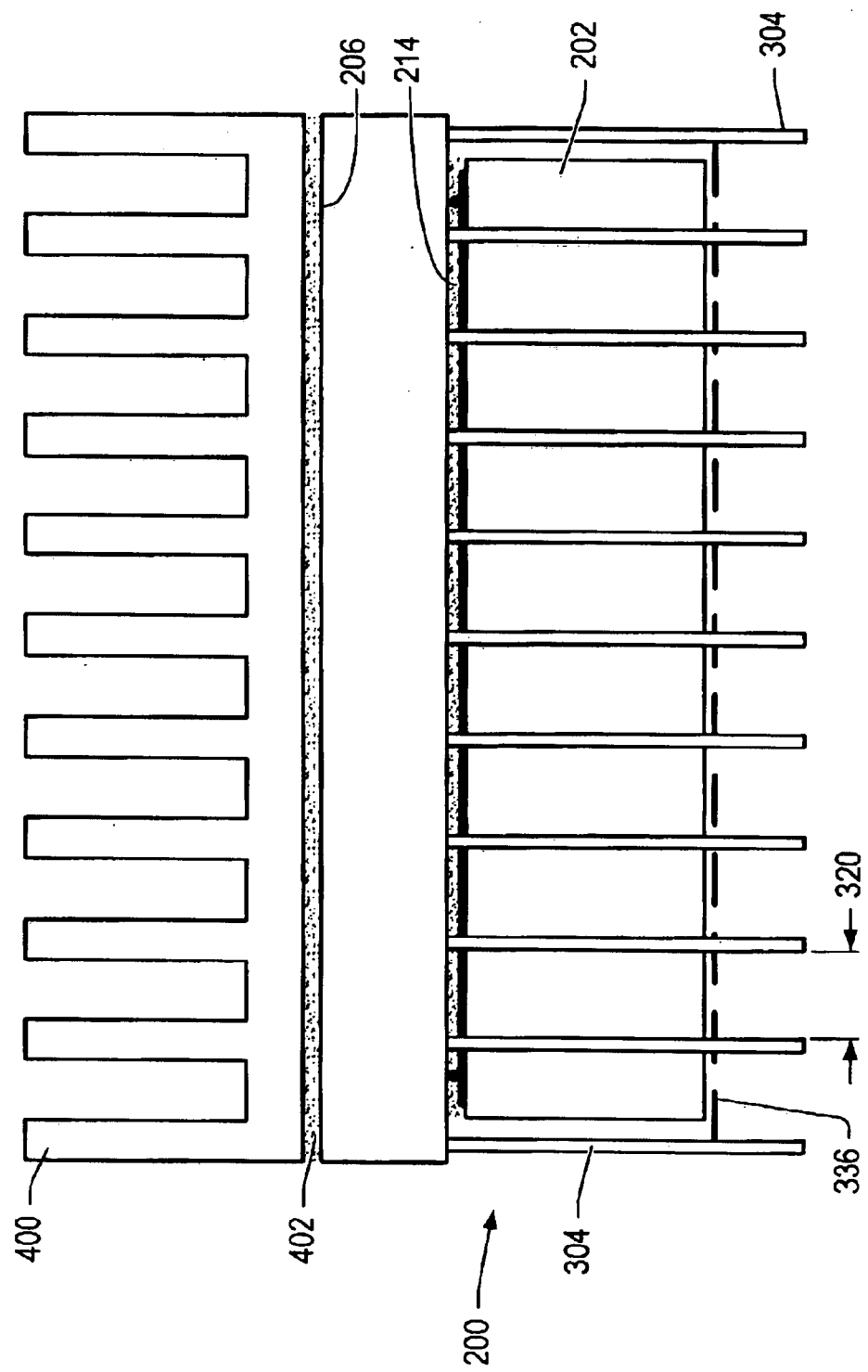
FIG. 2C depicts an external side view of an integrated circuit package with a heatsink coupled to the package.

FIGS. 2A–2C depict an IC package 200 including a lid with EMI containment features. Referring to FIG. 2A, IC package 200 may include a substrate 202, a die 204 coupled to substrate 202, and a lid 206 placed over die 204 and substrate 202. Die underfill fills the gap between die 204 and substrate 202. Lid 206 may be coupled to die 204 using an adhesive 208. Lid 206 may be coupled to substrate 202 using an adhesive 214. Substrate 202 may have a number of internal layers, such as power planes, ground planes and signal layers. Substrate 202 may include regular leads 232 to electrically couple elements of IC package 200 with other components of a system.

Lid 206 may include a body 302. The edges of body 302 may extend beyond the sides of substrate 202 to form an overhang 303. Lid 206 may include a plurality of projections 304 along the periphery of the lid. Projections 304 may extend downward from body 302. Projections 304 may be spaced along the periphery of substrate 202. Projections 304 may be of sufficient length to reach printed circuit board 306.

In one embodiment, projections 304 may be pins. The pins may be substantially cylindrical, as shown in FIGS. 2B and 2C. It will be understood that projections 304 may be in many other forms, including, but not limited to, elongated tabs having a rectangular cross section.

Figure 5:
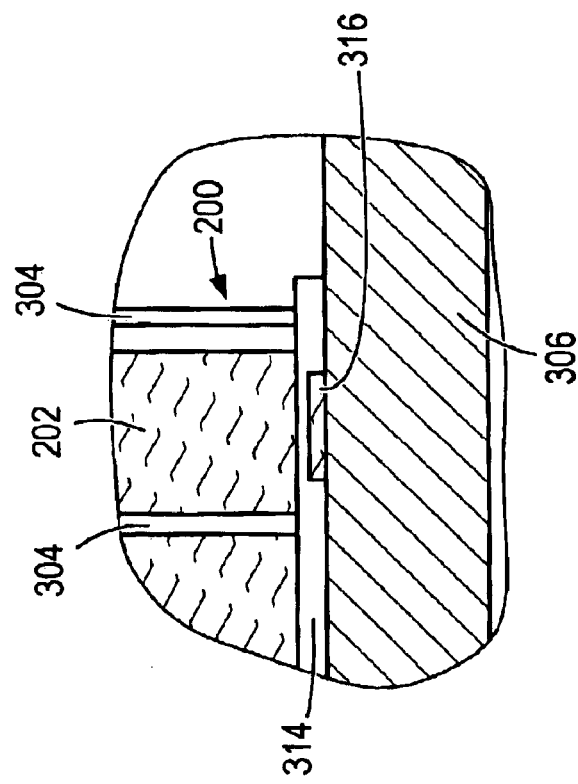
FIG. 5 depicts a detail view of a gasket interposed between lid projections and a printed circuit board.
Figure 3:
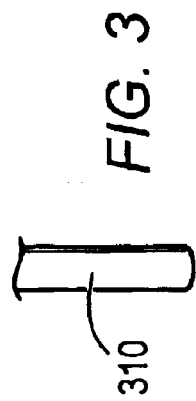
FIG. 3 depicts detail view of a lid projection including a through hole pin.
Figure 4:
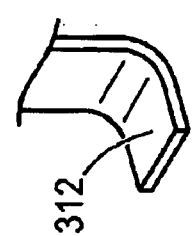
FIG. 4 depicts a detail view of a lid projection including a surface mount pad.

Each projection 304 may be adapted to couple with a ground plane 308 of printed circuit board 306. In an embodiment, ground plane 308 may be the solid ground plane of the printed circuit board that is nearest to IC package 200. Projections 304 may include various features for electrical coupling, including, but not limited to, through hole pins 310 (such as depicted in FIG. 3) or surface mount pads 312 (such as depicted in FIG. 4). In one embodiment, at least a portion of projections 304 may be adapted to couple with an elastic gasket 314. FIG. 5 shows a gasket 314 interposed between projections 304 and printed circuit board 306. Gasket 314 may form a conductive path from lid 206 to conductive elements on printed circuit board 306. Gasket 314 may be adapted to be compressed during use to improve thermal and electrical conductance at the mating surfaces of gasket 314. Gasket 314 may include slots 316 to provide clearance between gasket 314 and traces for pin escapes on the top surface of printed circuit board 306.

Printed circuit board 306 may include a conductive trace (not shown) on a top surface of printed circuit board 306. The conductive trace may be coupled to ground plane 308. In some embodiments, the conductive trace may form a continuous loop around the periphery of IC package 200. In other embodiments, the conductive trace only run along certain edges or portions of IC package 200, or may include breaks, such as to permit pin escapes on the top surface of the printed circuit board. The conductive trace may be configured to couple with gasket 314.

The regular leads 232 of IC package 200 may be any of a variety of types, including, but not limited to, Pin Grid Array (PGA), micro Pin Grid Array (μPGA), Ball Grid Array (BGA), or Land Grid Array (LGA). In an embodiment, printed circuit board 306 may include a socket configured to receive regular leads 232 and/or projections 304.

As depicted in FIG. 2C, projections 304 may be substantially regularly spaced along each side of substrate 202 to form gaps 320 between projections 304. Gaps 320 may promote rejection of heat from IC package 200. For example, gaps 320 may allow heat to be removed from the sides of substrate 202 by radiation and/or convection. The number of projections 304 and the size of gap 320 may be selected to ensure an effective EMI shield. For example, if gaps 320 are too large, shielding effectiveness may be reduced. An appropriate gap size may depend on, among other things, an operating frequency of a circuit. Higher frequencies may require a more dense spacing of the projections. In an embodiment, gaps 320 may be less than about 5 millimeters. In another embodiment, gaps 320 may be between about 3 millimeters and about 5 millimeters. In some embodiments, each side of the lid may include at least 4 projections.

Figure 6:
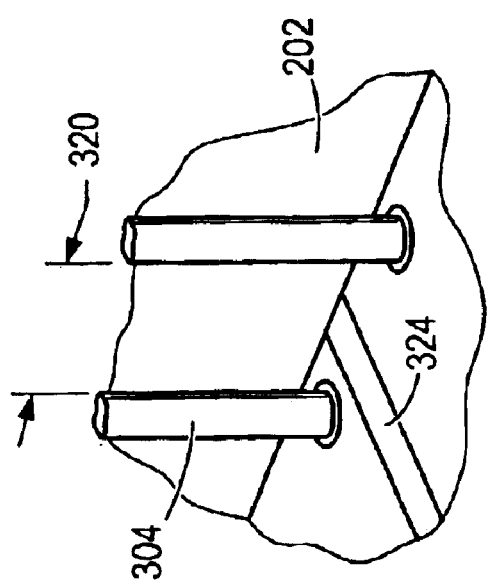
FIG. 6 depicts a detail view of a printed circuit board trace passing between two lid projections.

Referring to FIG. 6, gaps 320 between projections 304 may allow for pin escapes from regular leads 232 (not shown) of the IC package via traces 324 on the top surface of circuit board 306. For example, traces 324 may pass between two adjacent projections 304 of lid 206. Allowing for pin escapes between projections 304 may allow for a more efficient layout of pin outs in an integrated circuit and may facilitate design of such layouts.

Figure 7:
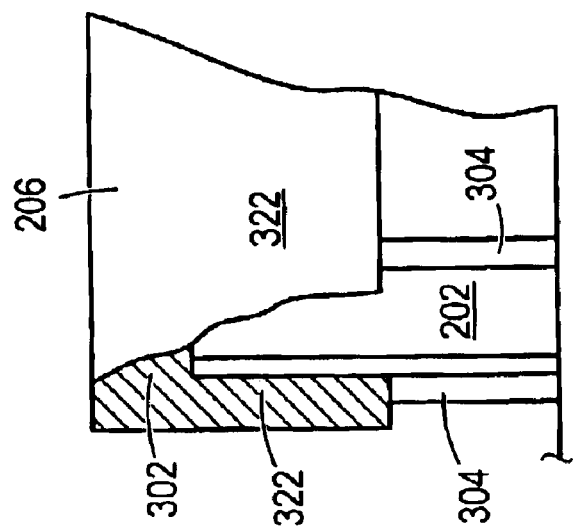
FIG. 7 depicts a lid including sides.

In certain embodiments, lid 206 may include sides. As depicted in FIG. 7, lid 206 may include sides 322 that extend downward from body 302 at least a portion of the distance between body 302 and printed circuit board 306. Projections 304 may extend from the bottom edges of sides 322, as shown in FIG. 7. In another embodiment, sides 322 may be exterior to projections 304. Sides 322 may provide additional EMI shielding for IC package 200.

Coupling a lid to a ground plane conductor in a printed circuit board using projections on the lid may provide a reliable, low impedance conductive path between the lid and the ground plane. The combination of lid 206 and ground plane 308 of printed circuit board 306 may create a Faraday cage around the integrated circuit of IC package 200. The Faraday cage may contain EMI close to its source before it can be radiated or coupled away from the source.

Lid 206 and projections 304, each alone or in combination, may be effective in containing the spread of electromagnetic energy produced by IC package 200. In particular, projections 304 may be effective at containing electromagnetic energy generated near the periphery of IC package 200, while lid 206 may be effective at containing electromagnetic energy generated in the central areas of IC package 200. Containing electromagnetic energy generated by IC package 200 may prevent EMI from adversely affecting the operation of other components coupled to printed circuit board 306, or even the operation of IC package 200 itself.

In some instances, the EMI features described herein may reduce EMI caused by coupling within the elements of substrate 202. During use, currents running through vias within substrate 202 may excite circular waves in the space between the internal layers of substrate 202, particularly between the power and ground planes. At the periphery of the internal structure of substrate 202, the circular waves may create a fringe field that is radiated to the outside of IC package 200. The open space between adjacent internal layers of substrate 202 may essentially act as a slot antenna that further radiates the noise. A Faraday cage including projections 304 may inhibit noise from spreading outside IC package 200.

In some embodiments, lid 206 may be electrically coupled to one or more ground planes internal to IC package 200. Referring again to FIG. 2A, IC package 200 may include one or more internal ground planes 222. A conductive trace 216 (shown in FIG. 2B) may be disposed on top surface 220 of substrate 202 near the periphery of IC package 200. Conductive trace 216 may be formed as part of the etching process used to prepare substrate 202. Lid 206 may be electrically coupled to conductive trace 216. Conductive trace 216 may in turn be coupled to internal ground plane 222A by vias 219.

Vias 219 may be located along conductive trace 216 at regular intervals. In one embodiment, vias 219 may be buried vias, as shown in FIG. 2A. It will be appreciated that vias 219 may be through vias in another embodiment.

Lid 206 may be coupled to substrate 202 using an adhesive 214. Adhesive 214 may be a conductive adhesive so as to form a conductive path between lid 206 and vias 219. Alternatively, solder bumps 218 may be used to solder lid 206 to conductive trace 216. In an embodiment, soldering may be accomplished using infrared soldering methods.

In one embodiment, internal ground plane 222A may be a ground plane for I/O functions. In another embodiment, internal ground plane 222A may be a ground plane for core functions. Internal ground plane 222A may be the solid ground plane of substrate 202 that is nearest to die 204. In certain embodiments, lid 206 may be coupled to a plurality of internal ground planes 222 in substrate 202.

Lid 206 may be coupled to die 204 using adhesive 208. In an embodiment, adhesive 208 may be a conductive epoxy. Using a conductive epoxy may promote the transfer of heat from die 204 to lid 206. On the other hand, if magnetic field effects are dominant, a nonconductive epoxy may be preferable for adhesive 208 to create a higher impedance path from die 204 to lid 206. A nonconductive epoxy may provide lower thermal performance than a conductive epoxy, but such performance may be acceptable for low power chips that produce small amounts of heat. In other embodiments, adhesive 208 may be omitted altogether.

Lid 206 may be made of one or more electrically conductive materials. These materials may include, but are not limited to, copper or aluminum. In addition, the materials for lid 206 may be selected based on thermal conductivity. Constructing lid 206 from a material that is both a good electrical conductor and a good heat conductor may improve its performance in shielding electromagnetic energy and conducting heat away from an electronic component.

Projections 304 may be integrally formed with body 302. Alternatively, projections 304 may be produced as separate elements and then attached to body 302. For example, projections 304 may be pins that are soldered into holes in body 302.

In certain embodiments, all or part of lid 206 may be made of a material that has a coefficient of thermal expansion similar to that of substrate 202. For example, for a ceramic substrate, at least body 304 may be made of an alloy that includes iron and nickel, such as Kovar or Alloy 42. In some embodiments, a portion of projections 304 or body 302 may be plated with a metal. The plating material may be a material that enhances solderability, such as-gold or tin.

In an embodiment, a heatsink may be coupled to IC package 200. FIG. 2C depicts a heatsink 400 coupled to IC package 200. Heatsink may be coupled to IC package 200 by a variety of methods known to those skilled in the art, including, but not limited to, an adhesive, a clamp, or screws. In one embodiment, heatsink 400 may be coupled to integrated circuit using epoxy 402 disposed between the mating surfaces of lid 206 and heatsink 400.

In some embodiments, an adhesive between heatsink 400 and IC package 200 may be electrically conductive. In other embodiments, adhesive may be substantially not electrically conductive. Using a non-conductive adhesive may inhibit electromagnetic coupling between the heatsink and other elements of the system.

Various embodiments of a lid including EMI containment features may be used with a variety of electronic components. In general, various embodiments of the lid may be used with any component that may generate electromagnetic energy that may interfere with the operation of other components. The specific dimensions of each embodiment of lid 206 may be customized for the specific component for which it is to be used. Similarly, the specific shape of various embodiments of lid 206 may also be customized to fit the specific component with which it is to be used.

EMI features described herein may reduce or even eliminate the need for separate, dedicated EMI components. For example, the features may obviate a need for separate EMI enclosures or gaskets. In addition, it may be unnecessary to include a heatsink as an element of an EMI containment system. Thus, in some embodiments, a heatsink may be coupled to IC package 200 using an electrically nonconductive adhesive. Electrically isolating the heatsink from the EMI containment system reduce coupling between the heatsink and elements of the IC package, and may improve effectiveness of the EMI containment system.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An integrated circuit package comprising:
   a substrate;
   a die coupled to the substrate; and
   a lid coupled to the die, the lid comprising a plurality of electrically conductive projections along the periphery of the lid, the lid extending beyond the sides of the substrate to form an overhang, the plurality of projections extending downwardly from the overhang of the lid outside the substrate,
   wherein the plurality of projections are spaced from each other to define a plurality of air gaps along the periphery of the lid, the plurality of air gaps being configured to form a plurality of openings when the integrated circuit package is coupled to a circuit board, the plurality of openings being configured to allow heat to be rejected to the surroundings of the integrated circuit package from at least one side of the substrate directly by radiation and convection when the integrated circuit package is coupled to the circuit board,
   wherein the plurality of projections are adapted to electrically couple the lid to a ground plane of the circuit board during use, and wherein the plurality of projections are configured to contain EMI produced in the integrated circuit package during use.

2. The integrated circuit package of claim 1, wherein the projections are substantially regularly spaced along the sides of the lid.

3. The integrated circuit package of claim 1, wherein the projections comprise surface mount pads.

4. The integrated circuit package of claim 1, further comprising a gasket between the projections and the circuit board, wherein the gasket is adapted to electrically couple at least one of the projections to the ground plane of the circuit board.

5. The integrated circuit package of claim 1, wherein the gaps between the projections are less than about 5 millimeters.

6. The integrated circuit package of claim 1, wherein the plurality of projections comprises at least 4 projections along each side of the package.

7. The integrated circuit package of claim 1, wherein the substrate further comprises an internal ground plane, wherein the lid is electrically coupled to the internal ground plane.

8. The integrated circuit package of claim 1, wherein the substrate further comprises an internal ground plane and a plurality of vias, wherein the vias electrically couple the lid to the internal ground plane.

9. The integrated circuit package of claim 1, further comprising a solder, wherein the substrate further comprises an internal ground plane, wherein the solder is configured to electrically couple the lid to the internal ground plane.

10. The integrated circuit package of claim 1, further comprising an electrically conductive adhesive, wherein the substrate further comprises an internal ground plane, wherein the electrically conductive adhesive is configured to electrically couple the lid to the internal ground plane.

11. The integrated circuit package of claim 1, further comprising an electrically insulating adhesive disposed between the die and the lid.

12. The integrated circuit package of claim 1, further comprising an electrically conductive adhesive disposed between the die and the lid.

13. A lid for a semiconductor device package, the lid comprising a plurality of projections configured to pass over the sides of a substrate of the semiconductor device package when the lid is installed, wherein the plurality of projections are spaced from each other to define a plurality of air gaps along the periphery of the lid, the plurality of air gaps being configured to form a plurality of openings in at least one side of the lid when the lid is installed on the semiconductor device package and the semiconductor device package is installed on a circuit board the plurality of openings being configured to allow heat to be rejected to the surroundings of the semiconductor device package from at least one side of the substrate directly by radiation and convection when the lid is installed on the semiconductor device package and the semiconductor device package is installed on the circuit board.

wherein the plurality of projections are adapted to electrically couple the lid to a ground plane of a circuit board during use, and wherein the plurality of projections is configured to contain EMI produced by the integrated circuit package during use.

14. The lid of claim 13, wherein the projections are substantially regularly spaced along the sides of the lid.

15. The lid of claim 13, wherein the projections comprise at least 4 pins along each side of the lid.

16. The integrated circuit package of claim 1, further comprising a heatsink mechanically coupled to the lid, wherein the heatsink is electrically coupled to the lid.

17. The integrated circuit package of claim 1, further comprising a heatsink mechanically coupled to the lid, wherein the heatsink is electrically isolated from the lid.

18. A system comprising:

a circuit board;

a semiconductor device package coupled to the circuit board, the semiconductor device package comprising a substrate; and a lid installed on the semiconductor device package, the lid comprising a plurality of projections coupled to the circuit board in a plurality of apertures in the circuit board outside the substrate, wherein the plurality of projections are spaced from each other to define a plurality of air gaps along the periphery of the lid, the plurality of air gaps forming a plurality of openings in at least one side of the lid, the plurality of openings being configured to allow heat to be rejected to the surroundings of the semiconductor device package from at least one side of the substrate directly by radiation and convection.

wherein the plurality of projections are coupled with a ground plane of the circuit board, wherein the plurality of projections are configured to contain EMI produced by the semiconductor device package during use.

19. The lid of claim 18, wherein the plurality of projections comprises at least 4 pins along each side of the lid.

20. The lid of claim 18, wherein the plurality of projections comprises at least 4 surface mount pads along each side of the lid.

21. The integrated circuit package of claim 1, wherein at least one of the plurality of openings extends upwardly at least to about even with a top surface of the substrate.

22. The integrated circuit package of claim 1, wherein the plurality of openings comprises a plurality of openings on each side of the substrate, wherein the plurality of openings allow heat to be rejected to the surroundings of the integrated circuit package from all of the sides of the substrate directly by radiation and convection.

23. The integrated circuit package of claim 1, wherein the total area of the sides of the substrate exposed by the plurality of openings exceeds the total area of the sides of the substrate covered by the plurality of projections.

24. The lid of claim 13, wherein at least one of the plurality of openings extends upwardly at least to about even with a top surface of the substrate.

25. The lid of claim 13, herein the plurality of openings comprises a plurality of openings on each side of the substrate, the plurality of openings being configured to allow heat to be rejected to the surroundings of the semiconductor device package from all of the sides of the substrate directly by radiation and convection when the lid is installed on the semiconductor device package.

26. The system of claim 18, wherein at least one of the plurality of openings extends upwardly at least to about even with a top surface of the substrate.

* * * * *